(12) United States Patent
Yoon et al.

(10) Patent No.: US 7,672,175 B2
(45) Date of Patent: Mar. 2, 2010

(54) SYSTEM AND METHOD OF SELECTIVELY APPLYING NEGATIVE VOLTAGE TO WORDLINES DURING MEMORY DEVICE READ OPERATION

(75) Inventors: Sei Seung Yoon, San Diego, CA (US); Cheng Zhong, San Diego, CA (US); Dongkyu Park, San Diego, CA (US); Mohamed Hassan Abu-Rahma, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/972,696

(22) Filed: Jan. 11, 2008

(65) Prior Publication Data

US 2009/0180315 A1 Jul. 16, 2009

(51) Int. Cl.
*G11C 7/22* (2006.01)
(52) U.S. Cl. ............... 365/189.15; 365/171; 365/173; 365/185.18; 365/185.23; 365/230.06
(58) Field of Classification Search ............ 365/189.15, 365/171, 173, 185.23, 230.06, 185.18
See application file for complete search history.

(56) References Cited

U.S. PATENT DOCUMENTS

| | | | | |
|---|---|---|---|---|
| 5,943,262 A * | 8/1999 | Choi | ............ | 365/185.17 |
| 6,243,298 B1 * | 6/2001 | Lee et al. | ............ | 365/185.28 |
| 6,249,477 B1 * | 6/2001 | Ohtsuki | ............ | 365/230.06 |
| 6,285,593 B1 * | 9/2001 | Wong | ............ | 365/185.23 |
| 6,631,085 B2 * | 10/2003 | Kleveland et al. | ............ | 365/175 |
| 6,754,102 B2 * | 6/2004 | Kleveland et al. | ............ | 365/185.03 |
| 6,767,816 B2 * | 7/2004 | Kleveland et al. | ............ | 438/600 |
| 6,784,517 B2 * | 8/2004 | Kleveland et al. | ............ | 257/530 |
| 6,795,342 B1 * | 9/2004 | He et al. | ............ | 365/185.16 |
| 6,816,410 B2 * | 11/2004 | Kleveland et al. | ............ | 365/185.03 |
| 6,865,119 B2 * | 3/2005 | Becker | ............ | 365/189.11 |
| 6,903,965 B2 | 6/2005 | Ishikawa | | |
| 7,075,143 B2 * | 7/2006 | Fujiwara et al. | ............ | 257/324 |
| 7,184,318 B2 * | 2/2007 | Kurata et al. | ............ | 365/185.28 |
| 7,457,149 B2 | 11/2008 | Ho et al. | | |

OTHER PUBLICATIONS

International Search Report-PCT/US09/030540, International Search Authority-European Patent Office-May 12, 2009.
Written Opinion-PCT/US09/030540, International Search Authority-European Patent Office-May 12, 2009.

* cited by examiner

*Primary Examiner*—Viet Q Nguyen
(74) *Attorney, Agent, or Firm*—Sam Talpalatsky; Nicholas J. Pauley; Peter M. Kamarchik

(57) ABSTRACT

Systems and methods of selectively applying negative voltage to word lines during memory device read operation are disclosed. In an embodiment, a memory device includes a word line logic circuit coupled to a plurality of word lines and adapted to selectively apply a positive voltage to a selected word line coupled to a selected memory cell that includes a magnetic tunnel junction (MTJ) device and to apply a negative voltage to unselected word lines.

25 Claims, 7 Drawing Sheets

SYSTEM AND METHOD OF SELECTIVELY APPLYING NEGATIVE VOLTAGE TO WORDLINES DURING MEMORY DEVICE READ OPERATION

I. FIELD

The present disclosure is generally related to a system and method of leakage current reduction in magnetic random access memory (MRAM).

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Advances in electronic circuit design have enabled improved performance of electronic devices, including faster operation and reduced power consumption to extend useful battery life for portable devices. While new memory technologies, such as magnetic random access memory (MRAM) and spin-transfer torque random access memory (STT-RAM), offer potential for fast read/write operation at low power, these devices often have a small read margin, leading to difficulties in reliable current sensing and read detection. In addition, such devices often suffer from leakage current. Leakage current often affects the ability of the device to read data at low voltages, because current sense margin is reduced by current leakage.

III. SUMMARY

In a particular embodiment, a method of reading data from a memory array including magnetic tunnel junction (MTJ) devices is disclosed. The method includes applying a read signal to a bit line coupled to a memory array including a plurality of memory cells. Each of the plurality of memory cells includes a MTJ device. The method includes applying a positive voltage to a selected word line coupled to a selected memory cell of the memory array. The method further includes applying a negative voltage to unselected word lines coupled to the memory array.

In another particular embodiment, the memory device includes an array of memory cells. Each of the memory cells in the array of memory cells includes a magnetic tunnel junction (MTJ) device. The memory device also includes a plurality of bit lines coupled to the array of memory cells. The memory device further includes a plurality of word lines coupled to the array of memory cells. The memory device includes a bit line logic circuit coupled to the plurality of bit lines and adapted to apply a read signal to one of the plurality of bit lines coupled to a selected memory cell of the array of memory cells. The memory device includes a word line logic circuit coupled to the plurality of word lines and adapted to selectively apply a positive voltage to a selected word line of the plurality of word lines. The selected word line is coupled to the selected memory cell. The word line logic circuit applies a negative voltage to unselected word lines coupled to the memory array. The unselected word lines include each of the plurality of word lines other than the selected word line.

In another particular embodiment, the memory device includes a word line logic circuit coupled to a plurality of word lines and adapted to selectively apply a positive voltage to a selected word line coupled to a selected memory cell that includes a magnetic tunnel junction (MTJ) device and to apply a negative voltage to unselected word lines.

In another particular embodiment, a memory device is disclosed. The memory device includes means for applying a read signal to a bit line coupled to a memory array including a plurality of memory cells. Each of the plurality of memory cells includes a magnetic tunnel junction (MTJ) device. The memory device also includes means for applying a positive voltage to a selected word line coupled to a selected memory cell of the memory array. The memory device further includes means for applying a negative voltage to at least one unselected word line coupled to the memory array.

In another particular embodiment, a wireless device is disclosed that includes a processor and a wireless controller responsive to the processor. The wireless device also includes a memory device coupled to the processor. The memory device includes word line logic circuitry coupled to a plurality of word lines and adapted to selectively apply a positive voltage to a selected word line coupled to a selected memory cell comprising a magnetic tunnel junction (MTJ) device and to apply a negative voltage to unselected word lines.

One particular advantage provided by the disclosed embodiments is improved operation at lower operating voltages due to an increased memory read current margin. Another particular advantage is reduced power consumption due to reduced leakage current in a memory array.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
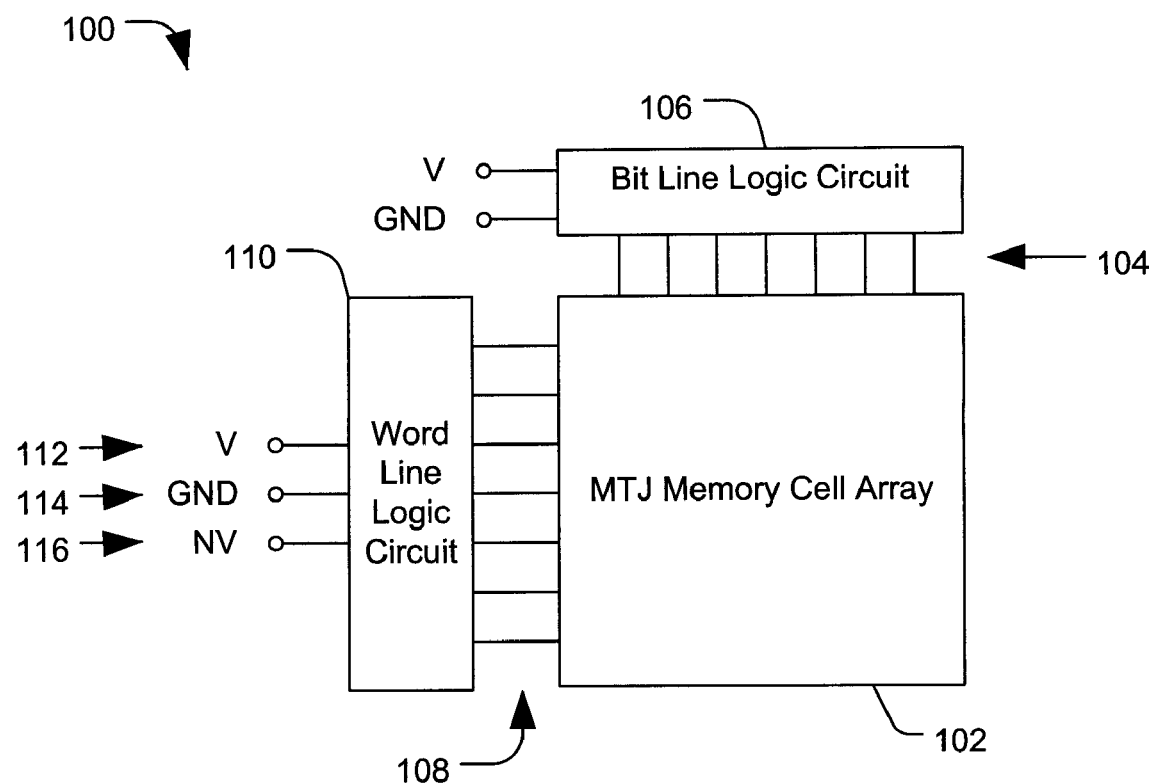
FIG. 1 is a block diagram of a particular illustrative embodiment of a system to apply a negative voltage to at least one word line during memory read operations.

Referring to FIG. 1, a particular embodiment of a system to apply a negative voltage to a word line during memory read operations is depicted and generally designated 100. The system 100 includes a memory cell array 102 coupled to a bit line logic circuit 106 via multiple bit lines 104. The memory cell array 102 is also coupled to a word line logic circuit 110 via multiple word lines 108. The word line logic circuit 110 is coupled to a positive voltage source (V) 112, a system ground (GRD) 114, and a negative voltage source (NV) 116.

In a particular embodiment, the memory cell array 102 includes an array of magnetic tunnel junction (MTJ) devices. Each MTJ device stores at least one data value that is represented by a resistance through the MTJ device. The resistance may result from a relative alignment of two magnetic fields in the MTJ device, which may be programmed by application of a write current at the MTJ device. In a particular embodiment, each memory cell of the memory cell array 102 may be read by applying a cell selection signal to a respective one of the multiple word lines 108 and a respective one of the multiple bit lines 104.

In a particular embodiment, the word line logic circuit 110 is configured to selectively apply a positive voltage to a selected word line that is coupled to the selected memory cell and to selectively apply a negative voltage to unselected word lines coupled to the memory array. The unselected word lines may include each of the multiple word lines 108 other than the selected word line. For example, the word line logic circuit 108 may be adapted to selectively couple one of the multiple word lines 108 to the positive voltage source (V) 112 and to concurrently couple the rest of the multiple word lines 108 to the negative voltage source (NV) 116. In a particular embodiment, although some or all of the electronic components (not shown) within the word line logic circuit 110 operate using the positive voltage source (V) 112 and the system ground (GND) 114, the word line logic circuit 110 only applies the positive or negative voltage, and not the system ground, to the multiple word lines 108.

During operation, the word line logic circuit 110 may determine a selected word line corresponding to a selected memory cell of the memory cell array 102, and the bit line logic circuit 106 may determine a selected bit line corresponding to the selected memory cell. The word line logic circuit 110 may apply the positive voltage to the selected word line and the negative voltage to the unselected word lines, while the bit line logic circuit may apply a positive voltage to the selected bit line and the system ground to the unselected bit lines. By applying the negative voltage to unselected word lines, a leakage current from memory cells coupled to non-selected word lines is reduced, enabling a more accurate determination of the current through, and therefore the resistance of, the selected memory cell. In a particular embodiment, reduced leakage current also enables smaller feature size and provides increased memory array density, lower operating voltage, reduced currents during data writes due to more sensitive data reads, increased number of memory cells per word line and larger array sizes, or any combination thereof.

As an illustrative, non-limiting example, the positive voltage may be in the range between approximately 3.3V (a common voltage for other electronic devices) and approximately 0.7V (e.g., for 32 nm or 22 nm technologies), and in a particular example may be between approximately 1.2V and approximately 2V. Similarly, in an illustrative, non-limiting example, the negative voltage may be in the range of about −0.2V to about −0.5V, so that the negative voltage may be large enough to substantially reduce leakage current but not large enough to adversely impact device operation. Although illustrative examples of potential ranges are provided, any positive and negative voltage may be used depending on the particular implementation.

Figure 2:
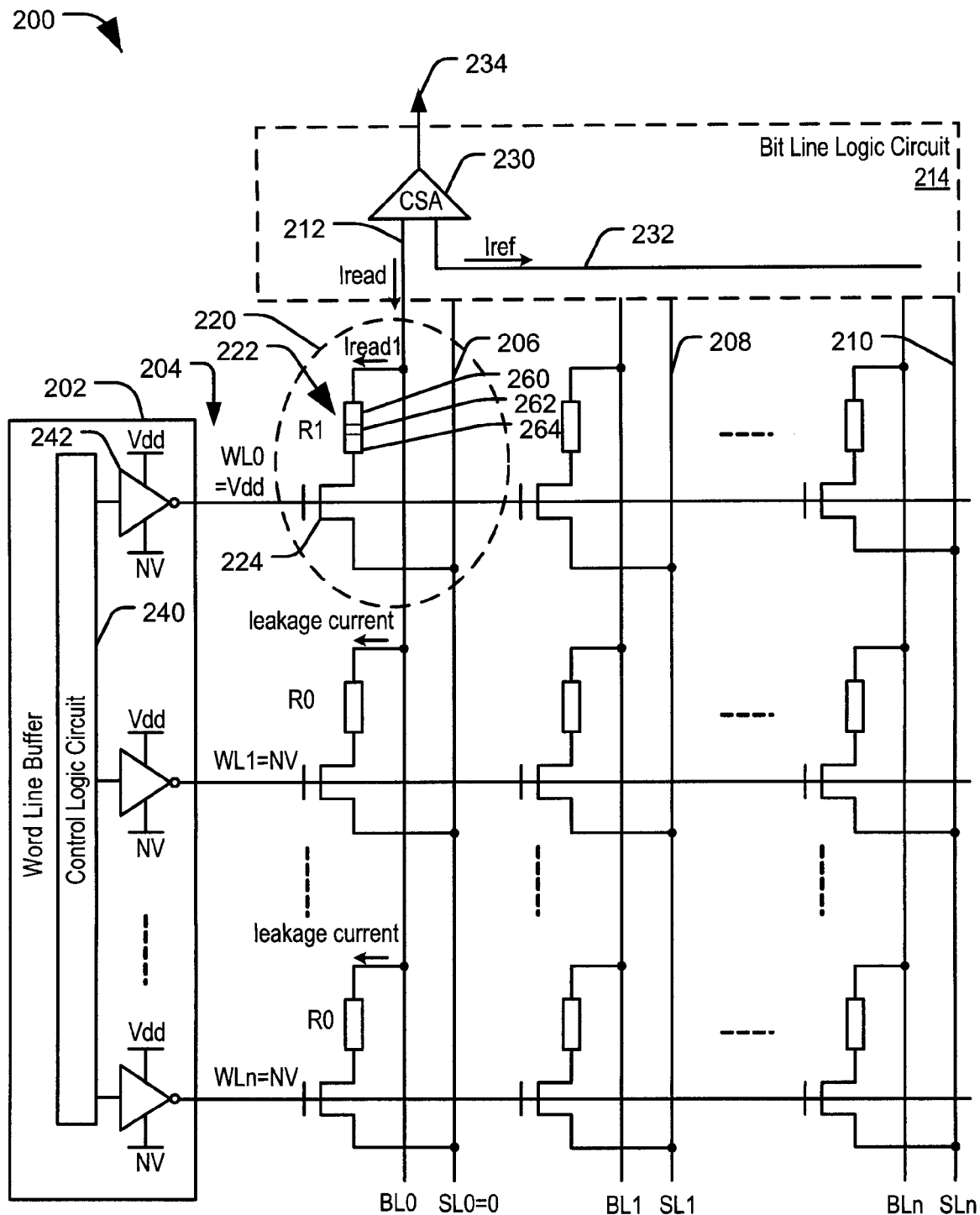
FIG. 2 is a diagram of a second illustrative embodiment of a system to apply a negative voltage to at least one word line during memory read operations of a memory device.

Referring to FIG. 2, a second illustrative embodiment of a system to apply a negative voltage to a word line during memory read operations is depicted and generally designated 200. The system 200 includes an array of memory cells, such as the representative memory cell 220. A word line buffer 202 is coupled to a set of word lines (WL0, WL1, . . . WLn) 204 that are coupled to the array of memory cells. A set of bit lines (BL0, BL1, . . . BLn) including representative bit line BL0 212 are coupled to the array of memory cells and further coupled to a bit line logic circuit 214. The array of memory cells is further coupled to a set of source lines (SL0, SL1, . . . , SLn). A comparison device 230 compares a signal at the representative bit line 212 to a signal at a reference line 232 to generate an output signal 234 that indicates a value stored at a selected memory cell.

In a particular embodiment, each memory cell includes a magnetic tunnel junction (MTJ) device, such as the representative MTJ device 222, coupled to a switching device, such as the representative transistor 224. Each MTJ device may include a free layer, a fixed layer, and a tunnel barrier, such as the representative free layer 260, tunnel barrier 262, and fixed layer 264 of the MTJ device 222. The fixed layer 264 may include a substantially fixed magnetic field having a first orientation, and the free layer 260 may include a magnetic field having a programmable orientation. When the magnetic field in the free layer 260 is oriented to match a first orientation, a resistance to current flow through the free layer 260 and the fixed layer 264 via the tunnel barrier 262 is lower than when the fields have opposite orientations. In a particular embodiment, the MTJ device operates as a spin-torque transfer (STT) device.

The bit line logic circuit 214 is adapted to apply a read signal to one of the set of bit lines BL0, BL1, . . . BLn that is coupled to a selected memory cell of the array of memory cells. In a particular embodiment, the read signal is a read voltage applied to the bit line 212 when the memory cell 220 is selected.

In a particular embodiment, the word line buffer 202 includes a control logic circuit 240 coupled to a set of drivers that includes the representative driver 242. Each driver is coupled to a respective word line of the set of word lines 204, a positive voltage (Vdd) source, and a negative voltage (NV) source. Each driver may be adapted to selectively couple either the Vdd source or the NV source to its respective word line based on an input received from the control logic circuit 240.

In a particular embodiment, the control logic circuit 240 is configured to selectively apply the positive voltage Vdd to a selected word line that is coupled to the selected memory cell and to apply the negative voltage to unselected word lines coupled to the memory array. In a particular embodiment, the control logic circuit 240 is configured to apply the negative voltage to each of the set of word lines 204 other than the selected word line by instructing each driver of a non-selected word line to couple the non-selected word line to the negative voltage (NV) source. In a particular embodiment, the control logic 240 may also be adapted to supply the negative voltage to each of the set of word lines 204 when none of the word lines are selected, such as during a standby state.

During operation, in a particular embodiment, a memory cell is selected for a read operation, such as the memory cell 220. The word line buffer 202 may selectively couple a selected word line (WL0) to the positive voltage source and couple the unselected word lines (WL1 . . . WLn) to the negative voltage source using the control logic circuit to instruct each driver to selectively couple a respective word line to either the positive voltage (Vdd) source or to the negative voltage (NV) source. In a particular embodiment, the unselected word lines include at least one of the set of word lines 204 other than the selected word line.

In a particular embodiment, applying the negative voltage enhances a read margin of the selected memory cell 220 because the negative voltage is sufficient to reduce a leakage current from the unselected memory cells. Thus, when the negative voltage is applied to the unselected word lines WL1 . . . WLn, but is not applied to the selected word line WL0, the resulting read current Iread is predominantly determined by a read current Iread1 through the selected memory cell 220 and not by leakage currents from the other memory cells coupled to the bit line 212. Thus, data values indicated by distinct levels of read current due to spin-torque transfer effects in the selected memory cell 220 may be distinguished over the "noise" in the read current caused by leakage currents. In a particular embodiment, the negative voltage is less than 0.5 volts, and as a non-limiting example may be about 0.2 volts less than a system ground voltage.

In a particular embodiment, the comparison device 230 includes a current sense amplifier (CSA) configured to compare the read current Iread at the bit line 212 to a reference current Iref, and to generate the output signal 234 based on the comparison. For example, when Iread<Iref, the output signal 234 may be a logical "1" value, and when Iread>=Iref, the output signal 234 may be a logical "0" value. Although the comparison device 230 is depicted as comparing a read current to a reference current that is responsive to a voltage across a memory cell (e.g., a potential difference applied between the bit line BL0 and the source line SL0), other methods of operation will be recognized by those skilled in the art as within the scope of the present disclosure. For example, as will be further described in conjunction with FIG. 4, the comparison device 230 may compare a voltage at the bit line 212 to a reference voltage in response to a current being applied across the memory cell 220. As another example, the comparison device 230 may be configured to determine a magnitude or sign of an input signal rather than perform a direct comparison to a reference signal.

In a particular embodiment, the system 200 may be included in one or more other components or devices. For example, the system 200 may be part of a random access memory (RAM) device. In an illustrative embodiment, each MTJ device such as the representative MTJ device 222 may be disposed within a bit cell of a spin-transfer torque random access memory (STT-RAM) device, and a current sense amplifier may be coupled to one or more of the bit cells.

Figure 3:
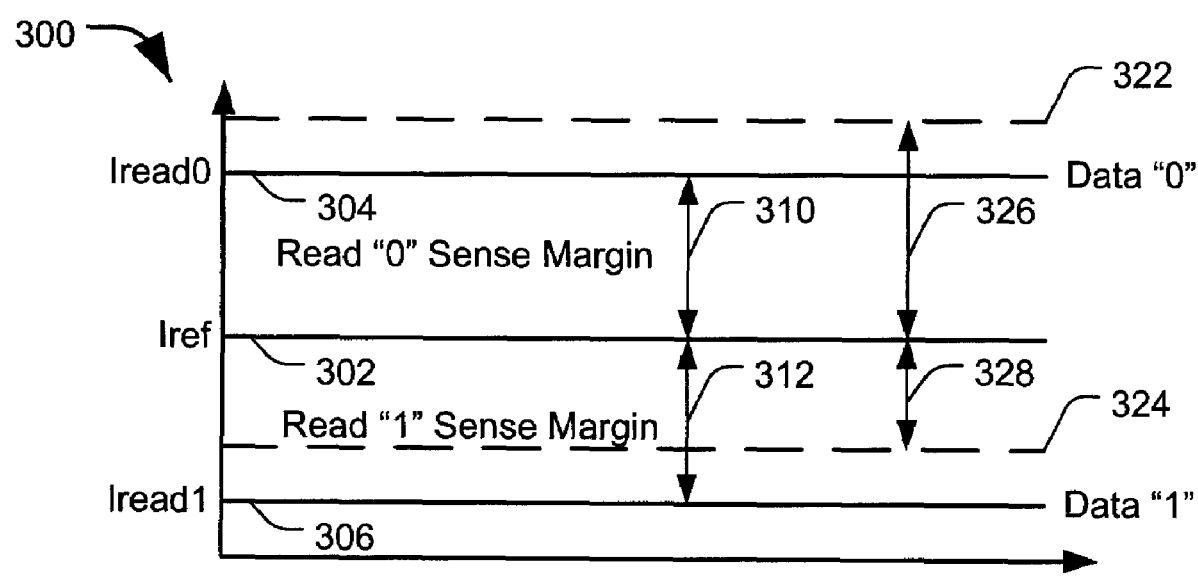
FIG. 3 is a diagram illustrating data read current sense margins.

Referring to FIG. 3, an illustration of data read current sense margins associated with reading a magnetic tunnel junction (MTJ) memory device is depicted and generally designated 300. A reference current level (Iref) 302 is illustrated as less than a "0" value read current level (Iread0) 304 and greater than a "1" value read current level (Iread1) 306 along a vertical axis. A read "1" sense margin 312 indicates a difference between the reference current level 302 and the "1" value read current level 306. A read "0" sense margin 310 depicts a difference between the "0" value read current level 304 and the reference current level 302.

In an illustrative embodiment, the reference current level 302 may correspond to the reference signal Iref 232, and the read current levels 304 and 306 may correspond to respective values of the read current Iread1 when a "0" or "1" data value is read at the memory cell 220 of the system 200 of FIG. 2, in the absence of leakage current from other memory cells. Each of the read sense margins 310 and 312 may represent a noise tolerance associated with a read operation, such that a maximum allowable random noise level is the lesser of the read sense margins 310 and 312. Thus, tolerance to random noise is improved when the read sense margins 310 and 312 are approximately equal.

However, leakage current generated by nonselected memory devices coupled to a data read line adds to the total current on the data read line, shifting the "0" value read current level and the "1" value read current level to the shifted levels 322 and 324, respectively. When the reference current level 302 does not shift, a new read "0" sense margin 326 increases and a new read "1" shift margin 328 decreases, compared to prior margins 310 and 312, respectively. Overall noise tolerance is therefore reduced, as a noise magnitude that is greater than the smaller of the two new read shift margins 326 and 328 can result in an erroneous result.

Leakage current generated by nonselected memory devices may be reduced by applying a negative voltage to word lines coupled to the nonselected devices. The negative voltage may be chosen to return the read sense margins to the substantially equal values of 310 and 312. Thus, device features of a memory array may be reduced, additional devices added to data read lines, operating voltages may be lowered, or any combination thereof, with reduced detrimental effects.

Figure 4:
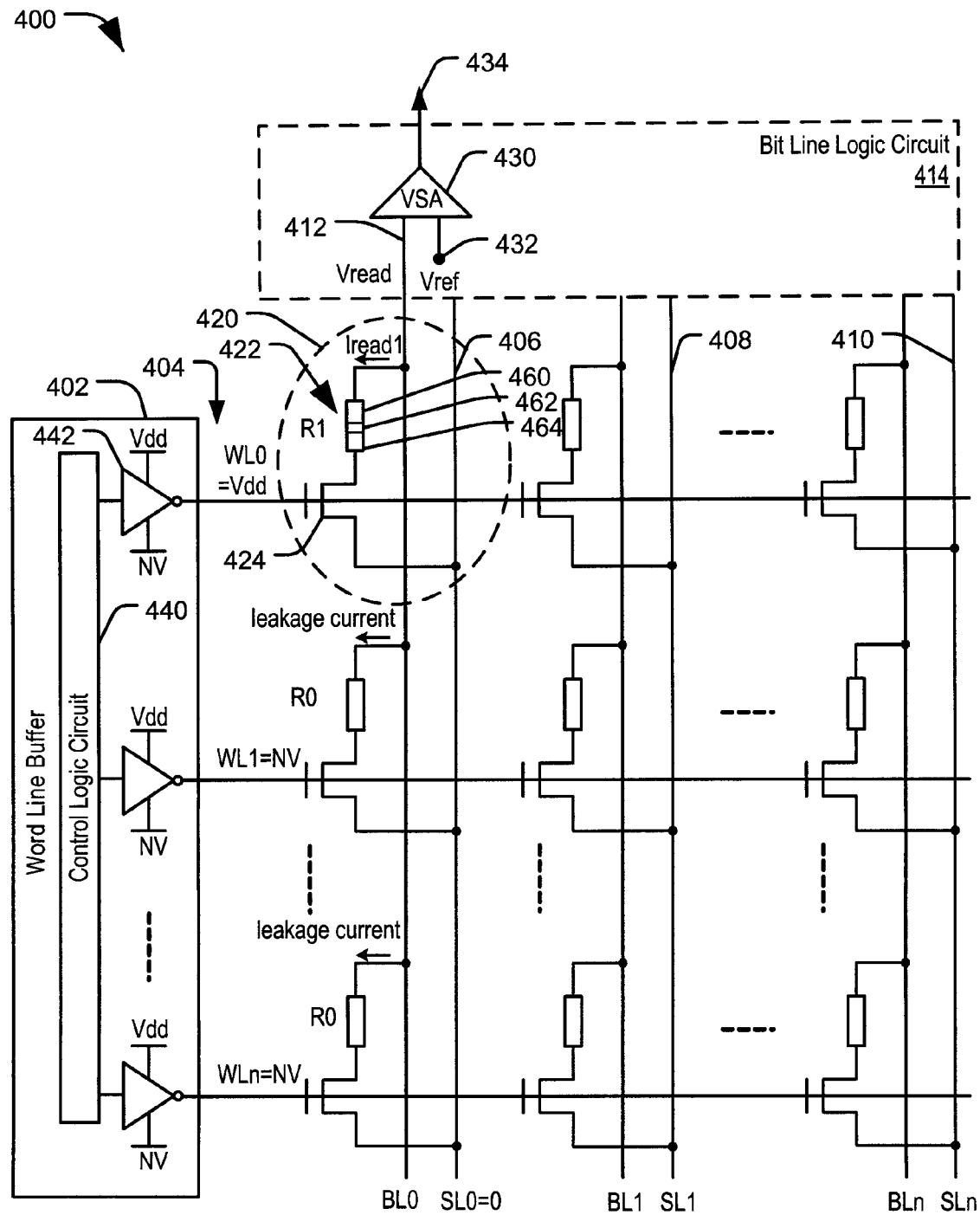
FIG. 4 is a diagram of a third illustrative embodiment of a system to apply a negative voltage to at least one word line during memory read operations of a memory device.

Referring to FIG. 4, a third illustrative embodiment of a system to apply a negative voltage to a word line during memory read operations is depicted and generally designated 400. The system 400 includes an array of memory cells, such as a representative memory cell 420. A word line buffer 402 is coupled to a set of word lines (WL0, WL1, . . . WLn) 404 that are coupled to the array of memory cells. A set of bit lines (BL0, BL1, . . . BLn) including representative bit line BL0 412 are coupled to the array of memory cells and further coupled to a bit line logic circuit 414. The array of memory cells is further coupled to a set of source lines (SL0, SL1, . . . SLn). A voltage comparison device 430 compares a voltage Vread at the representative bit line 412 to a reference voltage Vref 432 to generate an output signal 434 that indicates a value stored at a selected memory cell.

In a particular embodiment, each memory cell includes a magnetic tunnel junction (MTJ) device, such as the representative MTJ device 422, coupled to a switching device, such as the representative transistor 424. Each MTJ device may include a free layer, a fixed layer, and a tunnel barrier, such as the representative free layer 460, tunnel barrier 462, and fixed layer 464 of the MTJ device 422. The fixed layer 464 may include a substantially fixed magnetic field having a first orientation, and the free layer 460 may include a magnetic field having a programmable orientation. When the magnetic field in the free layer 460 is oriented to match a first orientation, a resistance to current flow through the free layer 460 and the fixed layer 464 via the tunnel barrier 462 is lower than when the fields have opposite orientations. In a particular embodiment, the MTJ device operates as a spin-torque transfer (STT) device.

In a particular embodiment, the bit line logic circuit 414 is adapted to apply a read signal to one of the set of bit lines BL0, BL1, . . . BLn that is coupled to a selected memory cell of the array of memory cells, by applying a read current to the bit line 412 when the memory cell 420 is selected.

In a particular embodiment, the word line buffer 402 includes a control logic circuit 440 coupled to a set of drivers that includes the representative driver 442. Each driver is coupled to a respective word line of the set of word lines 404, a positive voltage (Vdd) source, and a negative voltage (NV) source. Each driver may be adapted to selectively couple either the Vdd source or the NV source to its respective word line based on an input received from the control logic circuit 440.

In a particular embodiment, the control logic circuit 440 is configured to selectively apply the positive voltage Vdd to a selected word line that is coupled to the selected memory cell and to apply the negative voltage to unselected word lines coupled to the memory array. In a particular embodiment, the control logic circuit 440 is configured to apply the negative voltage to each of the set of word lines 404 other than the selected word line by instructing each driver of a non-selected word line to couple the non-selected word line to the negative voltage (NV) source. In a particular embodiment, the control logic 440 may also be adapted to supply the negative voltage to each of the set of word lines 404 when none of the word lines are selected, such as during a standby state.

During operation, in a particular embodiment, a memory cell is selected for a read operation, such as the memory cell 420. The word line buffer 402 may selectively couple a selected word line (WL0) to the positive voltage source and couple the unselected word lines (WL1 . . . WLn) to the negative voltage source using the control logic circuit to instruct each driver to selectively couple a respective word line to either the positive voltage (Vdd) source or to the negative voltage (NV) source. In a particular embodiment, the unselected word lines include at least one of the set of word lines 404 other than the selected word line.

In a particular embodiment, applying the negative voltage enhances a read margin of the selected memory cell 420 because the negative voltage is sufficient to reduce a leakage current from the unselected memory cells. Thus, when the negative voltage is applied to the unselected word lines WL1 . . . WLn, but is not applied to the selected word line WL0, the resulting read voltage Vread is predominantly determined by a read current Iread1 through a resistance of the selected memory cell 420 with reduced effects due to leakage currents at the other memory cells coupled to the bit line 412. Thus, data values indicated by distinct levels of read voltage due to spin-torque transfer effects in the selected memory cell 420 may be distinguished over the "noise" caused by leakage currents.

In a particular embodiment, the voltage comparison device 430 includes a voltage sense amplifier (VSA) configured to compare the read voltage Vread at the bit line 412 to a reference voltage Vref 432, and to generate the output signal 434 based on the comparison. For example, when Vread<Vref, the output signal 434 may be a logical "0" value, and when Vread >=Vref, the output signal 434 may be a logical "1" value.

In a particular embodiment, the system 400 may be included in one or more other components or devices. For example, the system 400 may be part of a random access memory (RAM) device. In an illustrative embodiment, each MTJ device such as the representative MTJ device 422 may be disposed within a bit cell of a spin-transfer torque random access memory (STT-RAM) device, and a voltage sense amplifier may be coupled to one or more of the bit cells.

Figure 5:
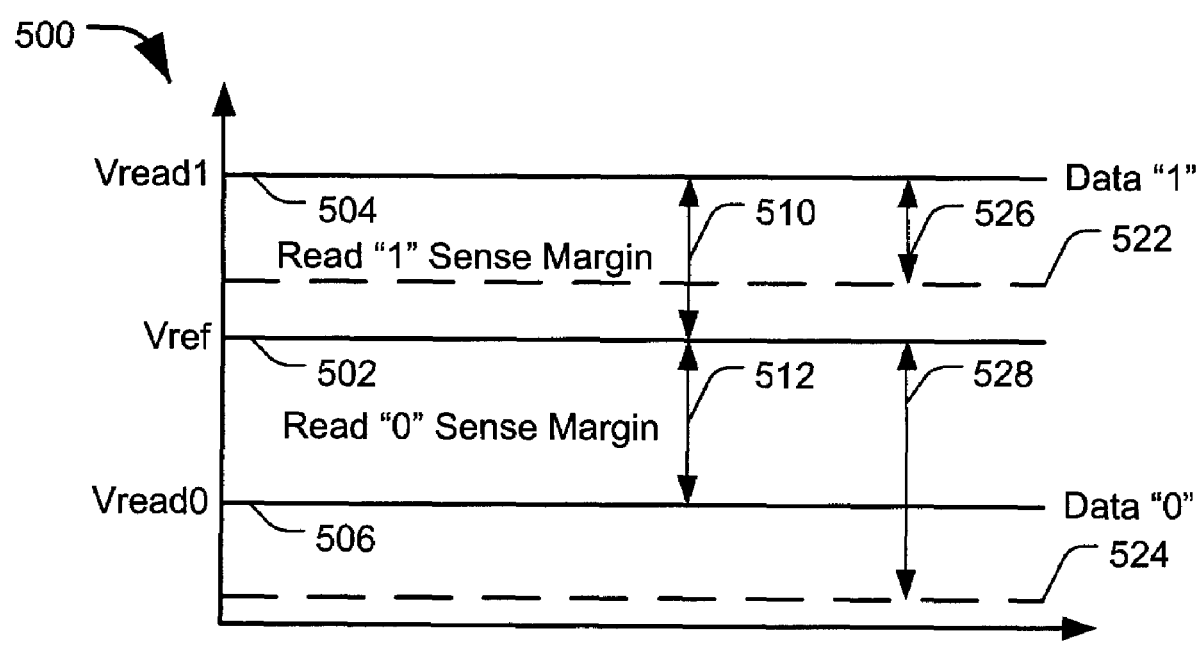
FIG. 5 is a diagram illustrating data read voltage sense margins.

Referring to FIG. 5, an illustration of data read voltage sense margins associated with reading a magnetic tunnel junction (MTJ) memory device is depicted and generally designated 500. A reference voltage level (Vref) 502 is illustrated as less than a "1" value read voltage level (Vread1) 504 and greater than a "0" value read voltage level (Vread0) 506 along a vertical axis. A read "0" sense margin 512 indicates a difference between the reference voltage level 502 and the "0" value read voltage level 506. A read "1" sense margin 510 depicts a difference between the "1" value read voltage level 504 and the reference voltage level 502.

In an illustrative embodiment, the reference voltage level 502 may correspond to the reference signal Vref 432, and the read voltage levels 504 and 506 may correspond to respective values of the read voltage due to Iread1 through a resistance of the memory cell 420 when a "0" or "1" data value is read at the memory cell 420 of the system 400 of FIG. 4, in the absence of leakage current from other memory cells. Each of the read sense margins 510 and 512 may represent a noise tolerance associated with a read operation, such that a maximum allowable random noise level is the lesser of the read sense margins 510 and 512. Thus, tolerance to random noise is improved when the read sense margins 510 and 512 are approximately equal.

However, leakage current generated by nonselected memory devices coupled to a data read line diverts read current applied to the data read line away from the selected memory cell, shifting the "1" value read voltage level and the "0" value read voltage level to the shifted levels 522 and 524, respectively. When the reference voltage level 502 does not shift, a new read "1" sense margin 526 decreases and a new read "0" shift margin 528 increases, compared to prior margins 510 and 512, respectively. Overall noise tolerance is therefore reduced, as a noise magnitude that is greater than the smaller of the two new read shift margins 526 and 528 can result in an erroneous result.

Leakage current generated by nonselected memory devices may be reduced by applying a negative voltage to word lines coupled to the nonselected devices. The negative voltage may be chosen to return the read sense margins to the substantially equal values of 510 and 512. Thus, device features of a memory array may be reduced, additional devices added to data read lines, operating voltages may be lowered, or any combination thereof, with reduced detrimental effects.

Figure 6:
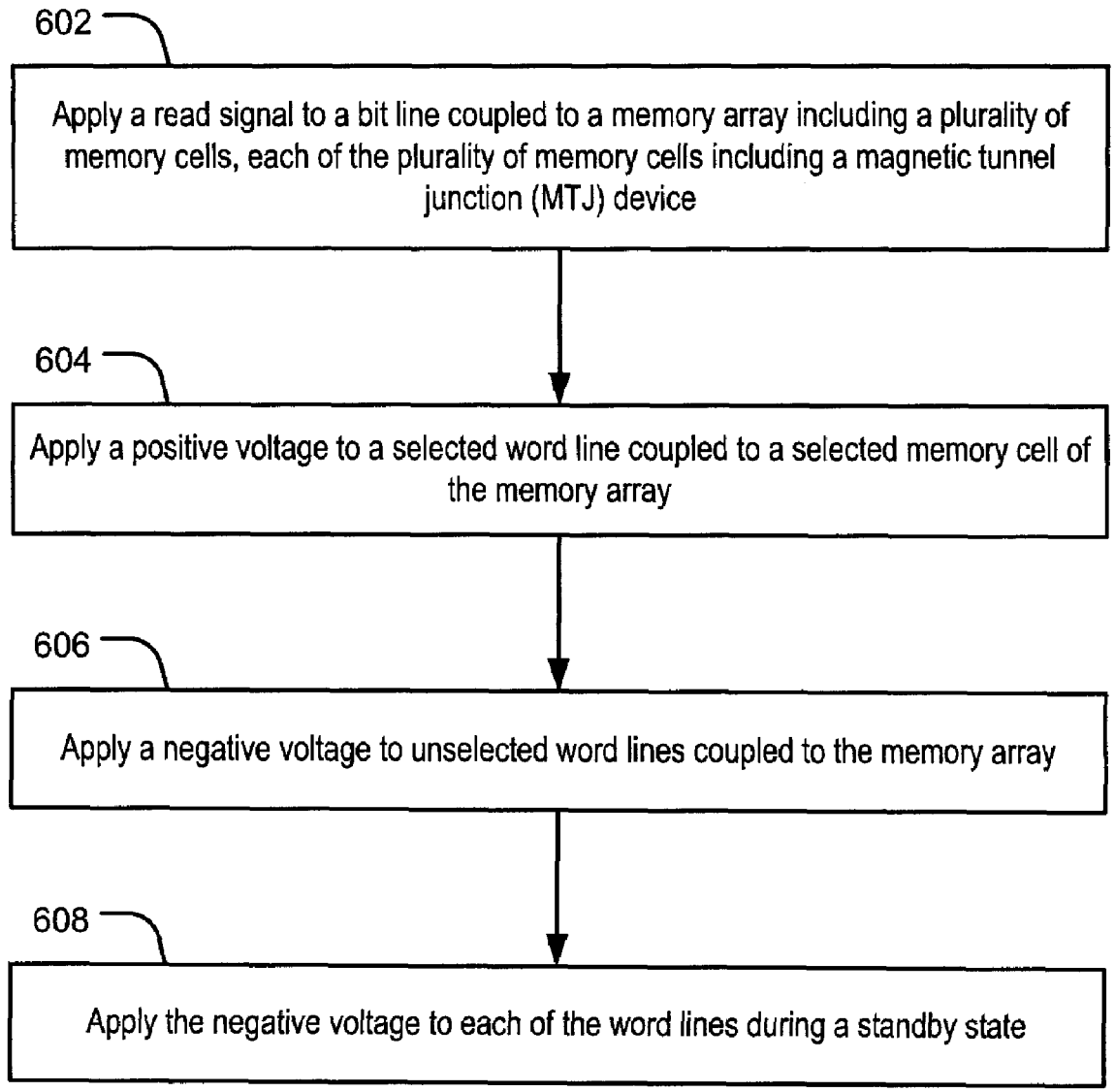
FIG. 6 is a flow chart of a particular embodiment of a method of reading data from a memory array including magnetic tunnel junction (MTJ) devices.

Referring to FIG. 6, a particular embodiment of a method of reading data from a memory array including magnetic tunnel junction (MTJ) devices is depicted. At 602, a read signal is applied to a bit line coupled to a memory array including a plurality of memory cells. Each of the plurality of memory cells includes a MTJ device. In a particular embodiment, each MTJ device includes a free layer, a fixed layer, and a tunnel barrier, so that a data value may be represented by an orientation of a magnetic field in the free layer relative to a magnetic field in the fixed layer. In a particular embodiment, the read signal includes a read voltage, and the data value may be read by comparing a current at the MTJ device to a reference current, as illustrated in FIGS. 2-3. In another embodiment, the read signal includes a read current, and the data value may be read by comparing a voltage at the MTJ device to a reference voltage, as illustrated in FIGS. 4-5.

Moving to 604, a positive voltage is applied to a selected word line coupled to a selected memory cell of the memory array. Continuing to 606, a negative voltage is applied to unselected word lines coupled to the memory array. In a particular embodiment, the positive voltage and the negative voltage are determined by a word line logic circuit, such as the word line logic circuit 110 illustrated in FIG. 1, the control logic circuit 240 illustrated in FIG. 2, or the control logic circuit 440 illustrated in FIG. 4. In a particular embodiment, applying the negative voltage enhances a read margin of the selected memory cell by reducing leakage current from memory cells coupled to the unselected word lines.

Proceeding to 608, in a particular embodiment, the negative voltage is applied to each of the word lines during a standby state. Overall power consumption may be reduced due to reduced leakage current in the memory array during the standby state when the negative voltage is applied to each of the word lines.

Figure 7:
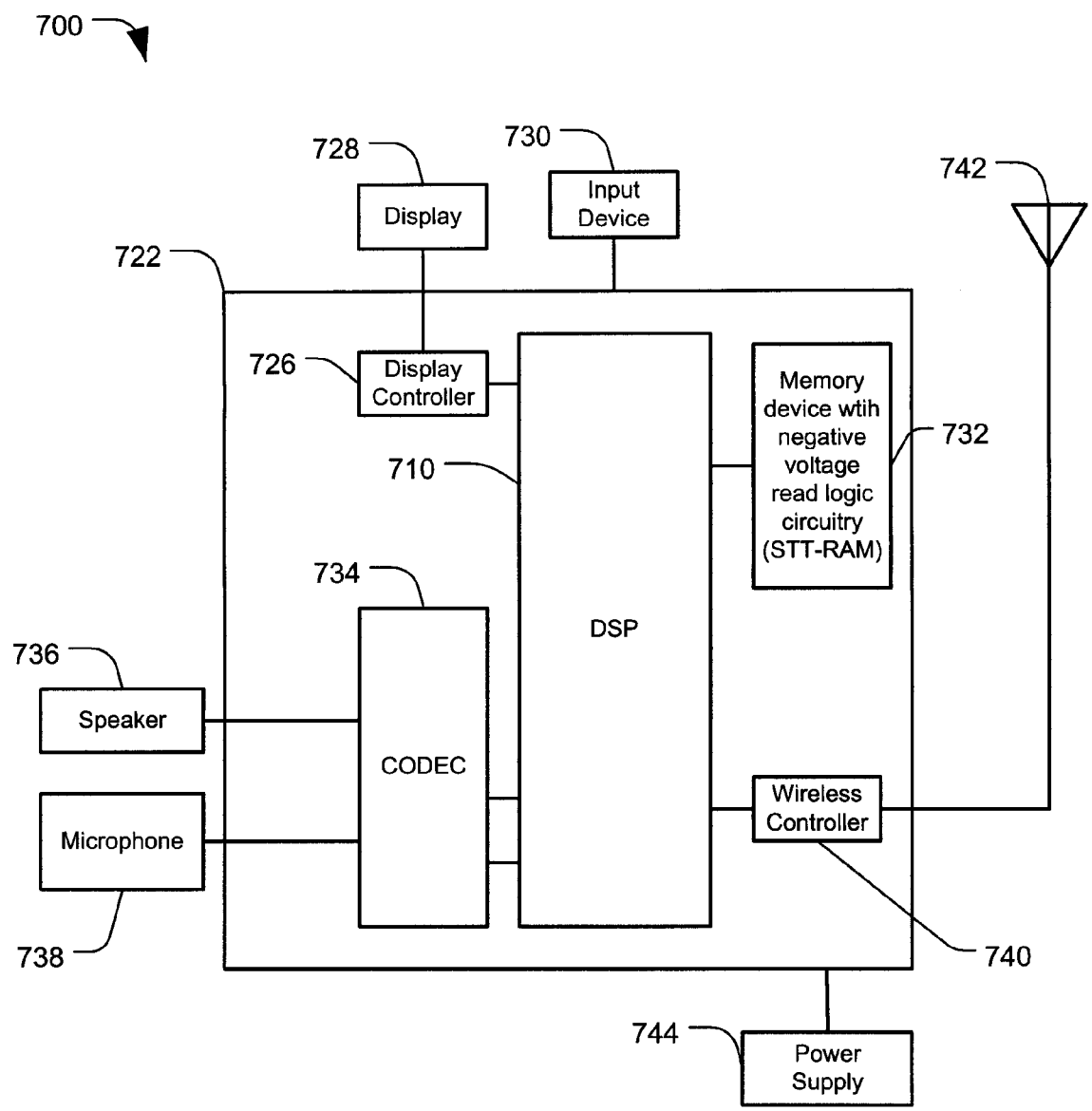
FIG. 7 is a block diagram of a wireless communications device including a memory device with negative voltage read logic circuitry.

FIG. 7 is a block diagram of an illustrative embodiment of a communications device 700, such as a wireless communications device, including a memory device with negative voltage read logic circuitry 732, which is coupled to a processor, such as a digital signal processor (DSP) 710. In a particular example, the memory device with negative voltage read logic circuitry 732 includes a memory array of magnetic tunnel junction (MTJ) cells and word line logic circuitry coupled to multiple word lines and configured to apply a negative voltage to word lines of unselected MTJ cells during read operations, as described with respect to FIGS. 1-6. In a particular embodiment, the memory device with negative voltage read logic circuitry 732 includes a spin-torque transfer random access memory (STT-RAM).

FIG. 7 also shows a display controller 726 that is coupled to the digital signal processor 710 and to a display 728. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to a wireless antenna 742 and responsive to the digital signal processor 710. In a particular embodiment, an input device 730 and a power supply 744 are coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each can be coupled to a component of the on-chip system 722, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method of reading data from a memory array including magnetic tunnel junction (MTJ) devices, the method comprising:
   applying a read signal to a bit line coupled to a memory array including a plurality of memory cells, each of the plurality of memory cells comprising a magnetic tunnel junction (MTJ) device;
   applying a positive voltage to a selected word line coupled to a selected memory cell of the memory array;
   applying a negative voltage to unselected word lines coupled to the memory array; and
   applying the negative voltage to each word line during a standby state.

2. The method of claim 1, wherein each MTJ device comprises a free layer, a fixed layers and a tunnel barrier.

3. The method of claim 1, wherein applying the negative voltage to the unselected word lines enhances a read margin of the selected memory cell by reducing leakage current from memory cells coupled to the unselected word lines.

4. The method of claim 1, wherein applying the negative voltage to the unselected word lines enhances a read margin of the selected memory cell.

5. The method of claim 1, wherein the read signal includes a read current or a read voltage.

6. A memory device comprising:
   an array of memory cells, each of the memory cells in the array of memory cells comprising a magnetic tunnel junction (MTJ) device;
   a plurality of bit lines coupled to the array of memory cells;
   a plurality of word lines coupled to the array of memory cells;
   a bit line logic circuit coupled to the plurality of bit lines and adapted to apply a read signal to one of the plurality of bit lines coupled to a selected memory cell of the array of memory cells; and
   a word line logic circuit coupled to the plurality of word lines and adapted to selectively apply a positive voltage to a selected word line of the plurality of word lines, the selected word line coupled to the selected memory cell, wherein the word line logic circuit applies a negative voltage to unselected word lines coupled to the memory array, the unselected word lines including each of the plurality of word lines other than the selected word line, and wherein the word line logic circuit applies the negative voltage to each of the plurality of word lines during a standby state.

7. A memory device comprising:
   a word line logic circuit coupled to a plurality of word lines and adapted to selectively apply a positive voltage to a selected word line coupled to a selected memory cell comprising a magnetic tunnel junction (MTJ) device and to apply a negative voltage to unselected word lines, wherein the negative voltage is applied to each of the plurality of word lines during a standby state.

8. The memory device of claim 7, further comprising a negative voltage source adapted to apply the negative voltage to the unselected word lines.

9. The memory device of claim 8, wherein the word line logic circuit selectively couples the negative voltage source to the unselected word lines.

10. The memory device of claim 8, further comprising an array of memory cells, each memory cell in the array of memory cells comprising an MTJ device.

11. The memory device of claim 7, further comprising:
an array of memory cells, each memory cell in the array of memory cells comprising a MTJ device, wherein the plurality of word lines are coupled to the array of memory cells;
a plurality of bit lines coupled to the array of memory cells; and
bit line logic circuitry coupled to the plurality of bit lines and adapted to apply a read signal to one of the plurality of bit lines coupled to a selected memory cell of the array of memory cells.

12. The memory device of claim 11, wherein the unselected word lines include at least one of the plurality of word lines other than the selected word line.

13. The memory device of claim 12, wherein each MTJ device comprises a free layer, a fixed layer, and a tunnel barrier.

14. The memory device of claim 7, wherein applying the negative voltage to the unselected word lines enhances a read margin of the selected memory cell.

15. The memory device of claim 11, wherein the read signal includes a read current or a read voltage.

16. The memory device of claim 7, wherein the negative voltage applied to the unselected word lines is sufficient to reduce a leakage current from the unselected memory cells.

17. The memory device of claim 7, wherein the negative voltage is applied to the unselected word lines, but is not applied to the selected word line, during a read operation.

18. The memory device of claim 7, wherein the MTJ device is disposed within a bit cell of a spin-transfer torque random access memory (STT-RAM) device.

19. The memory device of claim 18, further comprising a current sense amplifier coupled to the bit cell.

20. The memory device of claim 7, wherein the negative voltage is greater than −0.5 volts.

21. The memory device of claim 20, wherein the negative voltage is about −0.2 volts.

22. A memory device comprising:
means for applying a read signal to a bit line coupled to a memory array including a plurality of memory cells, each of the plurality of memory cells comprising a magnetic tunnel junction (MTJ) device;
means for applying a positive voltage to a selected word line coupled to a selected memory cell of the memory array; and
means for applying a negative voltage to at least one unselected word line coupled to the memory array; and
means for applying the negative voltage to each word line coupled to the memory array during a standby state.

23. The memory device of claim 22, further comprising a negative voltage source coupled to the means for applying the negative voltage.

24. A wireless device comprising:
a processor; and
a memory device coupled to the processor, the memory device including word line logic circuitry coupled to a plurality of word lines and adapted to selectively apply a positive voltage to a selected word line coupled to a selected memory cell comprising a magnetic tunnel junction (MTJ) device and to apply a negative voltage to unselected word lines, wherein the negative voltage is applied to each of the plurality of word lines during a standby state.

25. The wireless device of claim 24, wherein the memory device comprises a spin-transfer torque random access memory (STT-RAM) device.

* * * * *

UNITED STATES PATENT AND TRADEMARK OFFICE
CERTIFICATE OF CORRECTION

| | | |
|---|---|---|
| PATENT NO. | : 7,672,175 B2 | Page 1 of 1 |
| APPLICATION NO. | : 11/972696 | |
| DATED | : March 2, 2010 | |
| INVENTOR(S) | : Yoon et al. | |

It is certified that error appears in the above-identified patent and that said Letters Patent is hereby corrected as shown below:

Column 10, line 17, claim 2: "a fixed layers and a tunnel barrier." to read as --a fixed layer, and a tunnel barrier.--

Signed and Sealed this
Thirtieth Day of August, 2011

David J. Kappos
*Director of the United States Patent and Trademark Office*